United States Patent
Schrögmeier et al.

(10) Patent No.: US 6,285,605 B1
(45) Date of Patent: Sep. 4, 2001

(54) INTEGRATED MEMORY HAVING REDUNDANT UNITS OF MEMORY CELLS, AND TEST METHOD FOR THE REDUNDANT UNITS

(75) Inventors: Peter Schrögmeier, München; Stefan Dietrich, Türkenfeld; Sabine Schöniger, Miesbach; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/580,982

(22) Filed: May 30, 2000

(30) Foreign Application Priority Data

May 27, 1999 (DE) .............................................. 199 24 244

(51) Int. Cl.$^7$ ...................................................... G11C 7/00
(52) U.S. Cl. ............................................................ 365/200
(58) Field of Search ............................ 365/200, 189.07, 365/230.06, 225.7

(56) References Cited

U.S. PATENT DOCUMENTS

| 4,485,459 | 11/1984 | Venkateswaran | 365/200 |
| 6,091,649 | * 7/2000 | Choi | 365/200 |
| 6,097,645 | * 8/2000 | Penney et al. | 365/200 |

* cited by examiner

Primary Examiner—Trong Phan
(74) Attorney, Agent, or Firm—Herbert L. Lerner; Laurence A. Greenberg; Werner H. Stemer

(57) ABSTRACT

Each redundant unit of an integrated memory device is assigned respective programmable elements, comparison units, a code converting unit, a logic unit and a multiplexer. Each multiplexer has a first switching state, in which it connects outputs of the first comparison units to first inputs of the logic unit, and a second switching state, in which it connects outputs of the code converting unit to the first inputs of the logic unit. In the second switching state of the multiplexers, each redundant unit is assigned a different address in the unprogrammed state of the programmable elements. Therefore, redundant units can be selected individually for test purposes.

2 Claims, 3 Drawing Sheets

INTEGRATED MEMORY HAVING REDUNDANT UNITS OF MEMORY CELLS, AND TEST METHOD FOR THE REDUNDANT UNITS

BACKGROUND OF THE INVENTION

Field of the Invention

The invention relates to an integrated memory having redundant units of memory cells, and a test method for its redundant units.

A memory having redundant columns is for example described in U.S. Pat. No. 4,485,459. In this case, the redundant columns are intended to replace, in terms of the respective address, a regular column of the memory. The address of the respective normal column to be replaced is stored by programmable elements in the form of interruptible electrical connections (fusible links or fuses). If the regular column to be replaced is subsequently addressed, one of the redundant columns is selected instead of the regular column to be replaced. Defects in the regular columns can thus be repaired.

It is expedient, in the case of a memory, also to test the memory cells of the redundant units (columns and/or rows of the memory) before regular units are replaced by redundant units. Otherwise, it can happen that a defective redundant unit is used when the repair is carried out. However, testing of the redundant units is made difficult by the fact that the programmable elements, which are usually embodied as fuses, can only be programmed once. They cannot, therefore, be programmed before a redundancy repair is actually carried out, in order to test the associated redundant units. On the other hand, as a rule all the redundant units are assigned programmable elements which are in the same programming state. This means that the fuses used are all intact and not interrupted. In many realizations the consequence of this is that when a specific address (e.g. the address 0) is applied, all the redundant units are addressed at once. This means that the same address in each case is assigned to these redundant units in the unprogrammed state of their programmable elements. In order to test each individual redundant unit, however, it is necessary that each redundant unit can be addressed individually. Otherwise, it is not possible to ascertain which of the tested redundant units is defective and which is not.

SUMMARY OF THE INVENTION

It is accordingly an object of the invention to provide an integrated memory which overcomes the above-mentioned disadvantages of the heretofore-known integrated memory devices of this general type and whose redundant units of memory cells can be individually addressed even in the unprogrammed state of its programmable elements assigned to the redundant units. It also an object of the invention to provide a method for testing redundant units of an integrated memory.

With the foregoing and other objects in view there is provided, in accordance with the invention, a memory configuration, including:

an integrated memory having memory cell configurations with normal units and redundant units, the normal units being addressable by addresses having a width of m bits, the redundant units configured for replacing respective ones of the normal units with regard to the addresses;

the redundant units having respectively assigned m programmable elements, n<m first comparison units, m-n second comparison units, a code converting unit, a logic unit, and a multiplexer, m and n being integer numbers;

the m programmable elements storing an address of one of the normal units to be replaced;

the n<m first comparison units and the m-n second comparison units having respective outputs for comparing the address stored by the programmable elements with an address of m bits fed to the integrated memory;

the code converting unit having n inputs and having n outputs, the code converting unit being supplied with n of the m bits of the address fed to the integrated memory, the code converting unit subjecting the n of the m bits to a respective type of code conversion for forming n output bits, the respective type of code conversion being different for each of the redundant units;

the logic unit having n first inputs and having m-n second inputs for performing an AND function, the logic unit generating an activation signal for a respective one of the redundant units, the second inputs of the logic unit connected to the outputs of the second comparison units; and the multiplexer having n first multiplexer inputs, n second multiplexer inputs and n multiplexer outputs, the n multiplexer outputs being connected to the n first inputs of the logic unit, the multiplexer having a first switching state and a second switching state, the multiplexer, when being in the first switching state, connecting the outputs of the first comparison units to the first inputs of the logic unit, and the multiplexer, when being in the second switching state, connecting the outputs of the code converting unit to the first inputs of the logic unit.

In other words, in the case of the integrated memory according to the invention, the redundant units of memory cells are each assigned programmable elements for storing an address, comparison units for comparing the stored address with an address fed to the memory, a code converting unit, a logic unit for performing an AND function and a multiplexer. The code converting unit subjects n<m of the m bits of the address fed to the memory to a code conversion, the type of code conversion being different for each redundant unit. The logic unit generates an activation signal for the respective redundant unit at its output. The multiplexer has two switching states. In the first switching state, all the comparison units are connected on the output side to corresponding inputs of the logic unit. In the second switching state, only n-m of the comparison units are connected to the logic unit, while the multiplexer connects the outputs of the code converting unit to the remaining n inputs of the logic unit.

The first switching state of the multiplexers is suitable for a normal mode of the memory, in which the programmable elements are already programmed, so that the redundant units are assigned in address terms to specific normal units of memory cells. In this case, each redundant unit is assigned a different address which has been stored by its programmable elements. Consequently, when a specific address is fed in, at most one of the redundant units is selected. The second switching state of the multiplexers can nonetheless advantageously serve, in the unprogrammed state of the programmable elements, in which the latter allocate the same address in each case to the associated redundant units, for carrying out an individual addressing of the redundant units. This is necessary in particular for testing the redundant units, which has to be carried out before the programmable elements are programmed. The code converting units assigned to the redundant units ensure that respectively different n bits are fed simultaneously to the associated logic units in the second switching state of the multiplexers. Since each code converting unit carries out a different code conversion, for each address fed to the memory, at most in the case of one of the code converting units, the n bits which it generates at its output are all logic ones. Since these are subsequently fed to the AND function, at most one of the redundant units can be addressed simultaneously in the second switching state of the multiplexers.

With the objects of the invention in view there is also provided, a method for testing redundant units of an integrated memory, which includes the steps of: providing an integrated memory having memory cell configurations with normal units and redundant units, the normal units being addressable by addresses having a width of m bits, the redundant units configured for replacing respective ones of the normal units with regard to the addresses;

providing, for each of the redundant units, respective m programmable elements for storing an address of one of the normal units to be replaced;

providing, for each of the redundant units, respective n<m first comparison units and m-n second comparison units having respective outputs for comparing the address stored by the programmable elements with an address fed to the integrated memory;

providing, for each of the redundant units, a respective code converting unit having n inputs and having n outputs, supplying the code converting unit with n bits of the address fed to the integrated memory;

subjecting, with the code converting unit, the n bits to a respective type of code conversion and forming n output bits, the respective type of code conversion being different for each of the redundant units;

providing, for each of the redundant units, a respective logic unit having n first inputs and having m-n second inputs for performing an AND function;

generating, with the logic unit, an activation signal for a respective one of the redundant units, the second inputs of the logic unit being connected to the outputs of the second comparison units;

providing, for each of the redundant units, a respective multiplexer having n first multiplexer inputs, n second multiplexer inputs and n multiplexer outputs, the n multiplexer outputs being connected to the n first inputs of the logic unit; and selectively bringing the multiplexer into a first switching state for connecting the outputs of the first comparison units to the first inputs of the logic unit, and, while the programmable elements are in an unprogrammed state, bringing the multiplexer into a second switching state for connecting the outputs of the code converting unit to the first inputs of the logic unit.

Although the invention is illustrated and described herein as embodied in an integrated memory having redundant units of memory cells, and a test method for its redundant units, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 4:
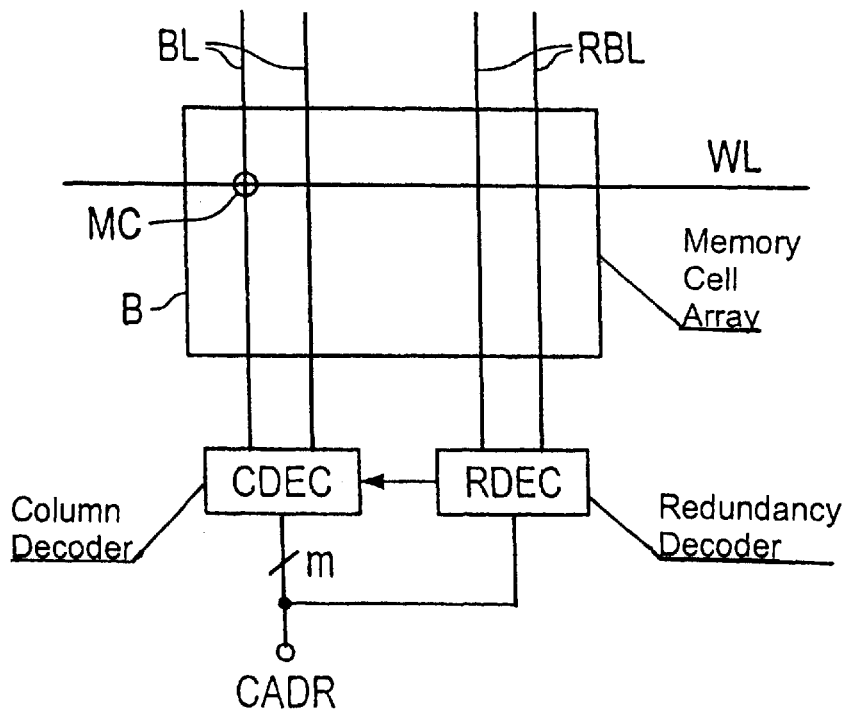
FIG. 4 a schematic block diagram of a memory cell array of an exemplary embodiment of the memory device according to the invention.

DESCRIPTION OF THE PREFERRED EMBODIMENTS:

Referring now to the figures of the drawings in detail and first, particularly, to FIG. 4 thereof, there is shown an exemplary embodiment of the integrated memory according to the invention. The memory cells MC of the integrated memory are configured at crossover points of normal bit lines BL or redundant bit lines RBL with word lines WL in a memory cell array B. The integrated memory may be, for example, a DRAM (Dynamic Random Access Memory). Although the redundant units of this exemplary embodiment are redundant bit lines, the invention can equally well be applied to redundant word lines.

The normal bit lines BL in FIG. 4 can be selected via a column decoder CDEC. The redundant bit lines RBL can be selected via a redundancy decoder RDEC. A column address CADR having a width of m bits is fed to the column decoder CDEC and to the redundancy decoder RDEC. In the redundancy situation, the redundancy decoder RDEC is programmed in such a way that, in the case of a specific column address CADR, one of the redundant bit lines RBL is selected instead of one of the normal bit lines BL. For this purpose, the corresponding address is stored in the redundancy decoder RDEC. If this address is subsequently fed to the memory, the redundancy decoder RDEC recognizes this and deactivates the column decoder CDEC, with the result that a selection of the corresponding normal bit lines BL does not occur.

Figure 1:
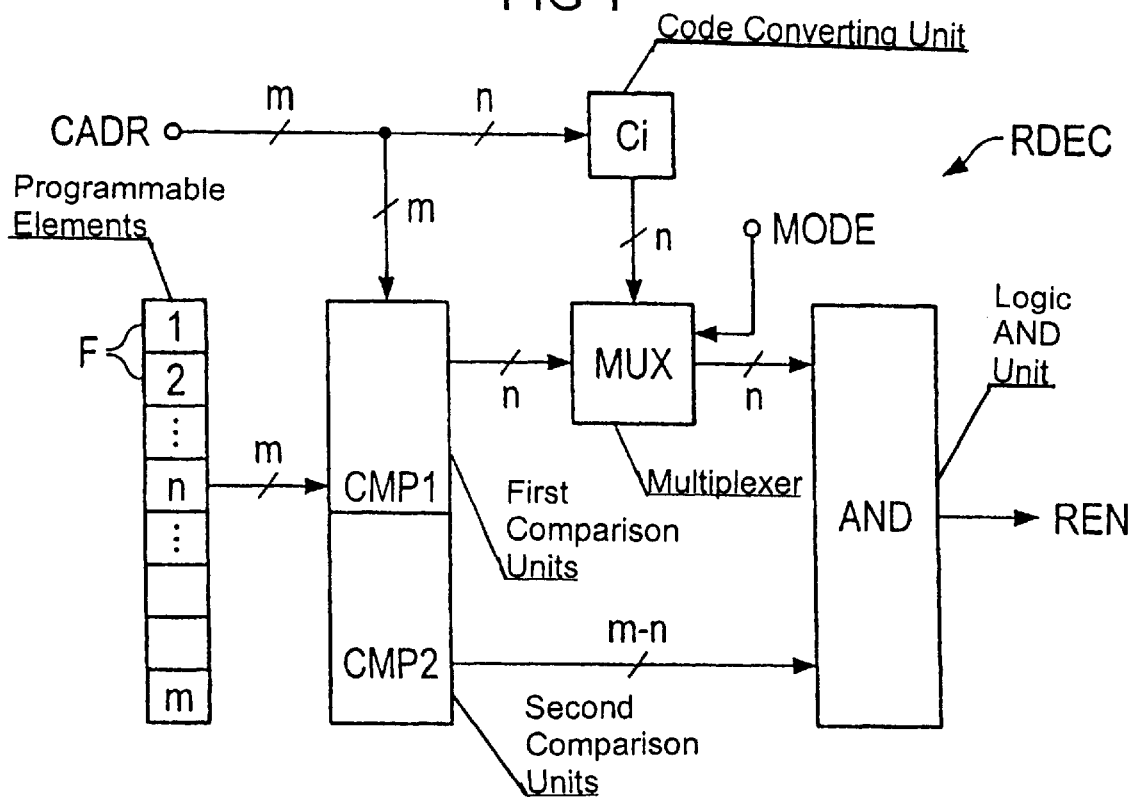
FIG. 1 is a schematic block diagram of an exemplary embodiment of the components assigned to a redundant unit of the memory device according to the invention.

FIG. 1 shows a detail of the redundancy decoder RDEC from FIG. 4. Each redundant bit line RBL is in each case assigned the components shown in FIG. 1. These involve programmable elements F in the form of interruptible electrical connections (fusible links or fuses), first comparison units CMP1, second comparison units CMP2, a multiplexer MUX, a code converting unit Ci, and a logic unit AND for performing an AND function.

Each redundant bit line RBL is assigned m of the fuses F. These serve for storing that address which is assigned to the respective normal bit line BL to be replaced. The programming state of each fuse determines whether a logic zero or a logic one is stored by the fuse. In the unprogrammed state, all the fuses are intact, which corresponds to the storage of a logic zero in this exemplary embodiment. Since this holds true for all the redundant bit lines RBL, the fuses F of all the redundant bit lines in each case store the same address, namely the address zero, in the unprogrammed state.

Each fuse F is assigned one of the comparison units CMP1, CMP2. Each comparison unit compares the logic state stored by the assigned fuse F with one of the m bits of the column address CADR fed to the memory. There are n<m first comparison units CMP1 and m-n second comparison units CMP2 provided. The outputs of the second comparison units CMP2 are connected to corresponding inputs of the logic unit AND.

The outputs of the first comparison units CMP1 are connected to corresponding inputs of the logic unit AND via the multiplexer MUX. At the output of the logic unit AND, the latter generates an activation signal REN, which has a high level in the event of correspondence between the address stored by the fuses F and the respective column address CADR which is present. As a result of this, the column decoder CDEC is deactivated and the redundant bit line RBL associated with the respective logic unit AND is selected.

The code converting unit Ci is fed n of the m bits of the column address CADR as a partial address. The code converting unit Ci performs a code conversion on these n bits. The code converting units Ci are each constructed differently for each redundant bit line RBL, with the result that they subject the n bits of the column address CADR to code conversion in different ways in each case.

Figure 2:
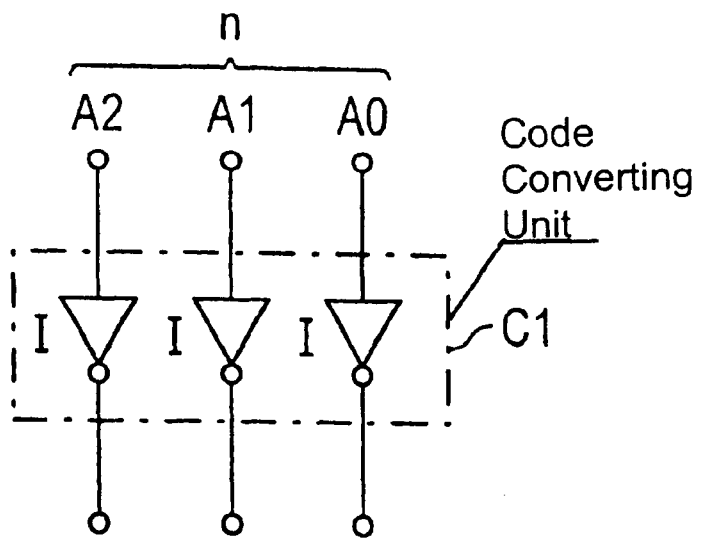
FIGS. 2 and 3 are schematic diagrams of exemplary embodiments of the code converting unit illustrated in FIG. 1.

FIG. 2 shows the code converting unit C1 of one of the redundant bit lines RBL. The code converting unit C1 has respective inverters I between its inputs and its outputs. The inverters invert the corresponding address bit A0 to A2 of the partial address of the column address CADR, the partial address having a width of n bits.

Figure 3:
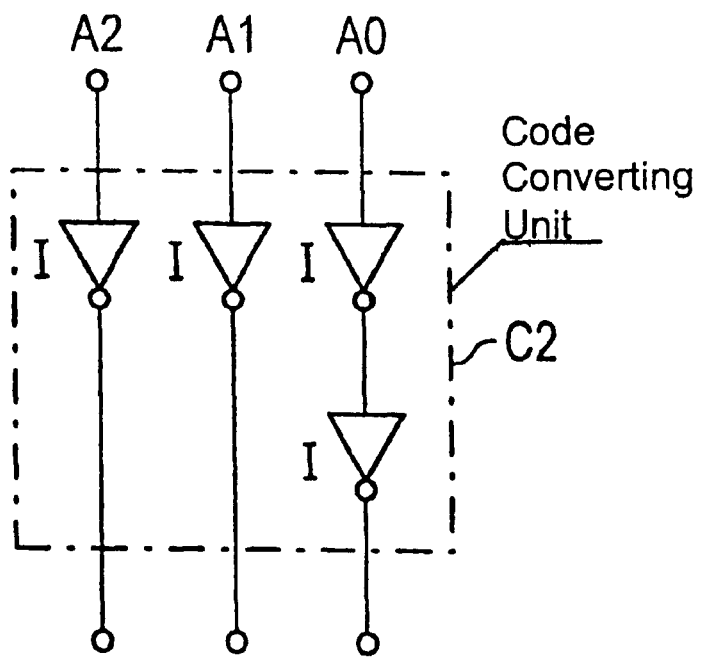

FIG. 3 shows the code converting unit C2 of another one of the redundant bit lines RBL of FIG. 4. Code converting unit C2 differs from the code converting unit C1 of FIG. 2 by the fact that the first address bit A0 is passed via two series-connected inverters I, with the result that it is present uninverted again at the corresponding output of the code converting unit C2.

The outputs of the code converting unit Ci in FIG. 1 are connected to the multiplexer MUX. The multiplexer MUX has two switching states. The switching states are selected by an operating mode signal MODE which is fed to it. In the first switching state of the multiplexer MUX, the latter connects the outputs of the n first comparison units CMP1 to the corresponding inputs of the logic unit AND. In the second switching state, it connects the outputs of the code converting unit Ci to these inputs of the logic unit AND. The multiplexer MUX assumes the first switching state during a normal operating mode of the memory. This is the case, in particular, while the fuses F are already programmed. The multiplexer MUX assumes its second switching state if the memory is in a test operating mode in which the redundant bit lines RBL are intended to be addressed individually for test purposes, while the fuses F have not yet been programmed.

As long as the fuses F have not yet been programmed (that is to say have not yet been destroyed), they all store a logic zero, as already mentioned. If corresponding zeros of the column address CADR are then fed to the second comparison units CMP2, logic ones are produced at the outputs of all of the comparison units CMP1, CMP2. If the multiplexer MUX is then in the first switching state, logic ones are exclusively fed to all the logic units AND, with the result that the activation signals REN of all the redundant bit lines RBL assume a high level. If, on the other hand, an address other than the address zero is fed to the memory, the comparison by the comparison units CMP1, CMP2 results for all the redundant bit lines RBL for at least one bit in a deviation, with the result that the corresponding comparison unit generates a logic zero. Consequently, none of the activation signals REN then has a high level, so that none of the redundant bit lines RBL is selected.

If, on the other hand, the multiplexer MUX is put into its second switching state in the unprogrammed state of the fuses F by the operating mode signal MODE, respectively different input signals are fed to the logic units AND of all the redundant bit lines RBL for each column address CADR fed to the memory. This is because each code converting unit Ci is constructed differently and performs a different code conversion on the n bits of the column address CADR which are fed to it.

By way of example, suppose that the column address CADR has a width of m=8 bits and that eight redundant bit lines RBL are present. Here, n=3 is chosen, since the eight redundant bit lines RBL can be individually addressed using these three bits. In the second switching state of the multiplexer MUX, the redundant bit line to which the code converting unit C1 shown in FIG. 2 is assigned is activated by the column address 00000000. The redundant bit line RBL to which the code converting unit C2 illustrated in FIG. 3 is assigned is selected by the column address CADR 00000001 in the second switching state of its multiplexer MUX. In this way, it is possible to allocate a respective different address to each redundant bit line RBL in the unprogrammed state of its fuses F.

In the exemplary embodiment considered here, the n=3 bits of the partial address of the column address CADR which are fed to the code converting units Ci are the least significant bits of the column address CADR. Therefore, the eight redundant bit lines RBL can be addressed through the use of the eight smallest addresses of the column address CADR. In other exemplary embodiments of the invention, however, the n-bit partial address may also be formed by any other of the m bits of the column address CADR.

Figure 5:
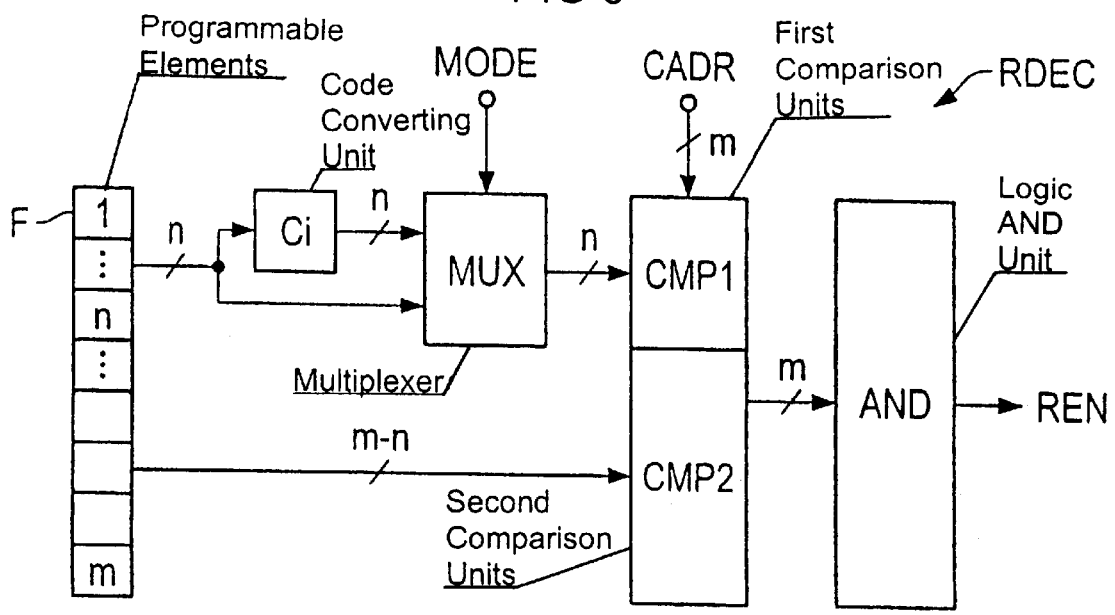
FIGS. 5 and 6 are schematic block diagrams of alternative exemplary embodiments of the components assigned to a redundant unit of the memory device according to the invention.

FIG. 5 shows another exemplary embodiment of that part of the redundancy decoder RDEC from FIG. 4 which corresponds to FIG. 1. This differs from FIG. 1 by the fact that the code converting unit Ci and the multiplexer MUX are provided between n of the fuses F and the associated first comparison units CMP1. In the first switching state of the multiplexer MUX, these n fuses are directly connected via the multiplexer MUX to the inputs of the first comparison units CMP1. In the second switching state of the multiplexer MUX, the n output signals of the code converting unit Ci are connected via the multiplexer MUX to the inputs of the n first comparison units CMP1. The output signals of the n fuses which are connected to the first comparison units CMP1 are fed to the n inputs of the code converting unit Ci.

The code converting units Ci in FIG. 5 can likewise be constructed like those shown in FIG. 2 and FIG. 3. In this case, too, each redundant bit line RBL is in each case assigned the components shown in FIG. 5, merely the structure of the code converting units Ci differing from redundant bit line to redundant bit line. Although the fuses F all store a logic zero in the unprogrammed state in the exemplary embodiment shown in FIG. 5 as well, in the second switching state of the multiplexer MUX, due to the different structure of the code converting units Ci, each redundant bit line RBL can be allocated a different column address CADR.

Figure 6:
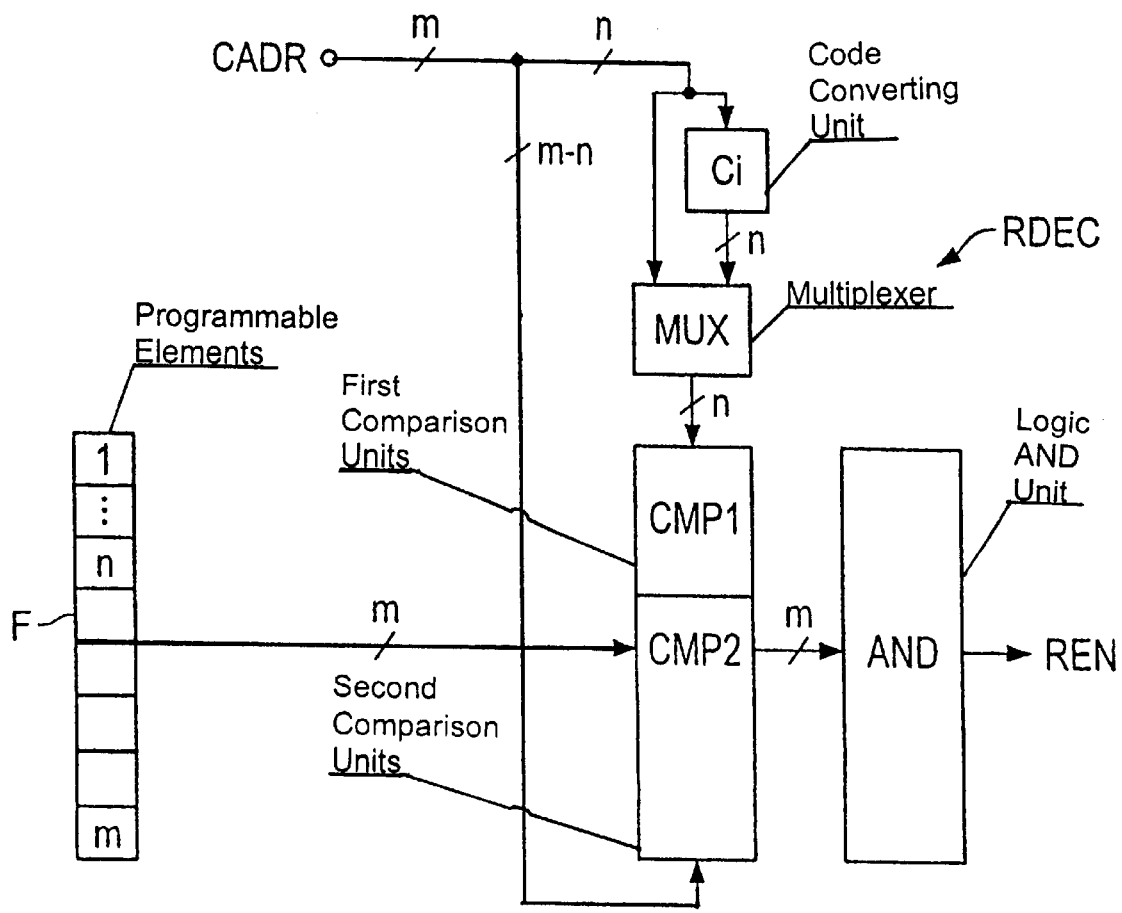

FIG. 6 shows a further alternative form for realizing the redundancy decoder RDEC from FIG. 4. The components corresponding to FIGS. 1 and 5 are again illustrated. The components are in each case assigned to one of the redundant bit lines RBL. In this exemplary embodiment, the code converting units Ci and the multiplexers MUX are provided between n of the m bits of the column address CADR and the n first comparison units CMP1. Here, m-n of the m address bits are directly connected to in each case one of the second comparison units CMP2. In the first switching state of the multiplexer MUX, the n bits of the partial address formed from the column address CADR are fed directly to the first comparison units CMP1. In the second switching state of the multiplexer MUX, the latter feeds the n output signals of the code converting unit Ci to the first comparison units CMP1.

In the exemplary embodiment in accordance with FIG. 6, too, the redundant bit lines RBL are selected with in each case different column addresses CADR in the unprogrammed state of the fuses F. This is because, due to the different structure of the code converting units Ci, logic zeros are exclusively present at the inputs of the first comparison units CMP1 for in each case different n-bit partial addresses of the column addresses CADR.

We claim:

1. An memory configuration, comprising:

an integrated memory having memory cell configurations with normal units and redundant units, said normal units being addressable by addresses having a width of m bits, said redundant units configured for replacing respective ones of said normal units with regard to the addresses;

said redundant units having respectively assigned m programmable elements, n<m first comparison units, m-n second comparison units, a code converting unit, a logic unit, and a multiplexer, m and n being integer numbers;

said m programmable elements storing an address of one of said normal units to be replaced;

said n<m first comparison units and said m-n second comparison units having respective outputs for comparing the address stored by said programmable elements with an address of m bits fed to said integrated memory;

said code converting unit having n inputs and having n outputs, said code converting unit being supplied with n of the m bits of the address fed to said integrated memory, said code converting unit subjecting the n of the m bits to a respective type of code conversion for forming n output bits, the respective type of code conversion being different for each of said redundant units;

said logic unit having n first inputs and having m-n second inputs for performing an AND function, said logic unit generating an activation signal for a respective one of said redundant units, said second inputs of said logic unit connected to said outputs of said second comparison units; and said multiplexer having n first multiplexer inputs, n second multiplexer inputs and n multiplexer outputs, said n multiplexer outputs being connected to said n first inputs of said logic unit, said multiplexer having a first switching state and a second switching state, said multiplexer, when being in the first switching state, connecting said outputs of said first comparison units to said first inputs of said logic unit, and said multiplexer, when being in the second switching state, connecting said outputs of said code converting unit to said first inputs of said logic unit.

2. A method for testing redundant units of an integrated memory, the method which comprises:

providing an integrated memory having memory cell configurations with normal units and redundant units, the normal units being addressable by addresses having a width of m bits, the redundant units configured for replacing respective ones of the normal units with regard to the addresses;

providing, for each of the redundant units, respective m programmable elements for storing an address of one of the normal units to be replaced;

providing, for each of the redundant units, respective n<m first comparison units and m-n second comparison units having respective outputs for comparing the address stored by the programmable elements with an address fed to the integrated memory;

providing, for each of the redundant units, a respective code converting unit having n inputs and having n outputs, supplying the code converting unit with n bits of the address fed to the integrated memory;

subjecting, with the code converting unit, the n bits to a respective type of code conversion and forming n output bits, the respective type of code conversion being different for each of the redundant units;

providing, for each of the redundant units, a respective logic unit having n first inputs and having m-n second inputs for performing an AND function;

generating, with the logic unit, an activation signal for a respective one of the redundant units, the second inputs of the logic unit being connected to the outputs of the second comparison units;

providing, for each of the redundant units, a respective multiplexer having n first multiplexer inputs, n second multiplexer inputs and n multiplexer outputs, the n multiplexer outputs being connected to the n first inputs of the logic unit; and selectively bringing the multiplexer into a first switching state for connecting the outputs of the first comparison units to the first inputs of the logic unit, and, while the programmable elements are in an unprogrammed state, bringing the multiplexer into a second switching state for connecting the outputs of the code converting unit to the first inputs of the logic unit.

* * * * *